(12) United States Patent
Fukui et al.

(10) Patent No.: US 11,045,004 B2
(45) Date of Patent: Jun. 29, 2021

(54) CHAIR WITH SOLAR PANEL

(71) Applicant: SHARP KABUSHIKI KAISHA, Sakai (JP)

(72) Inventors: Atsushi Fukui, Sakai (JP); Tomohisa Yoshie, Sakai (JP); Daisuke Toyoshima, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/619,283

(22) PCT Filed: Jun. 26, 2018

(86) PCT No.: PCT/JP2018/024117
§ 371 (c)(1),
(2) Date: Dec. 4, 2019

(87) PCT Pub. No.: WO2019/012982
PCT Pub. Date: Jan. 17, 2019

(65) Prior Publication Data
US 2020/0093272 A1 Mar. 26, 2020

(30) Foreign Application Priority Data
Jul. 14, 2017 (JP) .............................. JP2017-138176

(51) Int. Cl.
*A47C 7/62* (2006.01)
*H01L 31/042* (2014.01)

(52) U.S. Cl.
CPC .............. *A47C 7/62* (2013.01); *H01L 31/042* (2013.01)

(58) Field of Classification Search
CPC ............ A47C 7/725; A47C 7/62; H02S 99/00; H02S 40/38; H02S 30/20; H02S 20/20; H02J 7/0044; H02J 7/35; H01L 31/042; Y02E 10/50; B64D 2211/00; Y02T 50/50; Y02B 10/20; Y02B 10/10; F21S 9/032; F21S 9/00
USPC ................................ 297/217.1, 217.7, 217.3
See application file for complete search history.

(56) References Cited

U.S. PATENT DOCUMENTS

| | | | | |
|---|---|---|---|---|
| 5,975,630 | A * | 11/1999 | Schreiber | A47C 1/14 297/217.3 |
| 8,789,884 | B1 * | 7/2014 | Edelman | E05B 65/0075 297/188.13 |
| 8,795,015 | B1 * | 8/2014 | Nguyen | B63B 34/50 441/129 |
| 9,390,571 | B1 * | 7/2016 | Kupfer | H02J 7/342 |
| 10,092,092 | B2 * | 10/2018 | Koch | G06F 3/0304 |
| 10,614,694 | B1 * | 4/2020 | Zwier | G08B 25/08 |
| 10,633,911 | B2 * | 4/2020 | Edelman | A47C 7/62 |
| 2005/0242635 | A1 | 11/2005 | Cassaday | |
| 2008/0168920 | A1 * | 7/2008 | Nakashima | B65G 37/02 104/124 |

(Continued)

FOREIGN PATENT DOCUMENTS

| | | |
|---|---|---|
| JP | H11-125681 A | 5/1999 |
| JP | 2005-536251 A | 12/2005 |

(Continued)

*Primary Examiner* — Chi Q Nguyen
(74) *Attorney, Agent, or Firm* — ScienBiziP, P.C.

(57) ABSTRACT

A chair includes: a backrest having an opening or recess in a portion thereof; and a solar panel disposed on a face inside the opening or recess.

12 Claims, 10 Drawing Sheets

(56) References Cited

U.S. PATENT DOCUMENTS

| | | | | |
|---|---|---|---|---|
| 2011/0193372 A1* | 8/2011 | Pizzuto | ............... | A47C 7/72 |
| | | | | 297/16.1 |
| 2012/0205951 A1* | 8/2012 | Strolka-Echols | ...... | A47C 21/06 |
| | | | | 297/217.3 |
| 2014/0265481 A1 | 9/2014 | Riedel et al. | | |
| 2014/0368003 A1* | 12/2014 | Squires | ............... | A47C 4/20 |
| | | | | 297/16.2 |
| 2015/0303337 A1 | 10/2015 | Ishii et al. | | |
| 2016/0119700 A1* | 4/2016 | Miskin | ............... | H04R 1/323 |
| | | | | 381/333 |

FOREIGN PATENT DOCUMENTS

| | | | |
|---|---|---|---|
| JP | 2013-091994 A | 5/2013 | |
| JP | 2013-243225 A | 12/2013 | |
| JP | 2017-036578 A | 2/2017 | |
| KR | 10-2012-0041499 A | 5/2012 | |
| KR | 10-2012-0066445 A | 6/2012 | |
| KR | 10-2012-0071791 A | 7/2012 | |
| WO | 2014/109281 A1 | 7/2014 | |
| WO | 2017/099114 A1 | 6/2017 | |
| WO | 2017/099136 A1 | 6/2017 | |

\* cited by examiner

CHAIR WITH SOLAR PANEL

TECHNICAL FIELD

The present invention relates to chairs with a solar panel.

BACKGROUND ART

Published Japanese Translation of PCT Application, Tokuhyo, No. 2005-536251, as an example, discloses a chair equipped with a solar panel.

CITATION LIST

Patent Literature

Patent Literature 1: Published Japanese Translation of PCT Application, Tokuhyo, No. 2005-536251

SUMMARY OF INVENTION

Technical Problem

Some conventional chairs are equipped with a solar panel. The solar panel is however visible to the user from behind the chair and could damage the high-quality design of the chair.

This disclosure is made to address this problem and has an object to provide a chair including a solar panel so positioned as to be less recognizable from behind the chair to preserve the chair's high-quality design.

Solution to Problem

A chair with a solar panel in accordance with the disclosure includes: a backrest having an opening or a recess in a portion thereof; and a solar panel disposed on a face inside the opening or the recess.

The chair with a solar panel thus structured includes a solar panel on a face inside the opening or the recess. The solar panel is therefore less visible on such a chair than on conventional chairs. The structure hence does not damage the chair's high-quality design.

In an embodiment of the present disclosure, the recess is located in a top face of the backrest In an embodiment of the present disclosure, the recess is specified by a front internal face of the backrest and a rear internal face of the backrest, and the solar panel is disposed on the rear internal face.

In an embodiment of the present disclosure, the rear face is inclined such that deeper parts thereof are located closer to a front of the chair.

In an embodiment of the present disclosure, the backrest includes: an abutment member configured to come into contact with a user's back; and a frame positioning the abutment member, the opening or the opening being provided between the frame and the abutment member.

In an embodiment of the present disclosure, the recess is located in a rear face of the backrest.

In an embodiment of the present disclosure, the recess is specified by an upper internal face of the backrest and a lower internal face of the backrest below the upper internal face, and the solar panel is disposed on the lower internal face.

In an embodiment of the present disclosure, the backrest includes: an abutment member configured to come into contact with a user's back; and a frame positioning the abutment member, the backrest further including a support between the frame and the seating face, the recess being provided in the support.

In an embodiment of the present disclosure, the backrest includes: an abutment member configured to come into contact with a user's back; and a frame positioning the abutment member, the opening being provided between the frame and the abutment member.

In an embodiment of the present disclosure, the solar panel includes a plurality of solar cells connected in series, each solar cell extending lengthwise, and the solar panel is arranged such that the recess and the opening, in accordance with a shape thereof, do not cast a shadow across an entire length of any one of the solar cells.

In an embodiment of the present disclosure, the opening or the recess is covered by a member transmitting electromagnetic waves that can be used in the solar panel.

Advantageous Effects of Invention

The present invention provides a chair with a solar panel that preserves high-quality design.

DESCRIPTION OF EMBODIMENTS

The following will describe embodiments, which may be combined.

Embodiment 1

Figure 1:
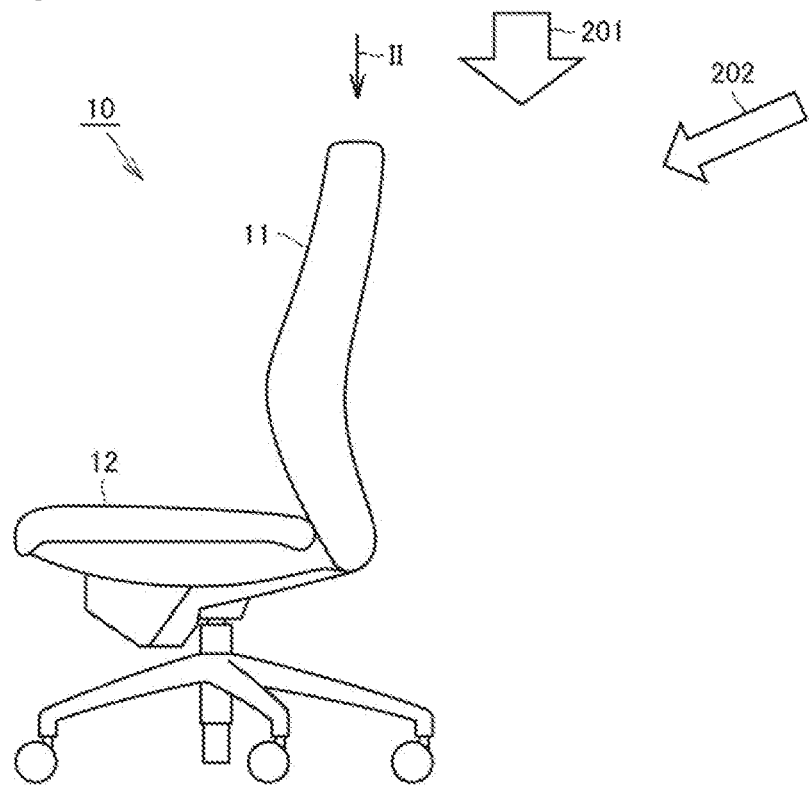
FIG. 1 is a side view of a chair in accordance with Embodiment 1.
Figure 2:
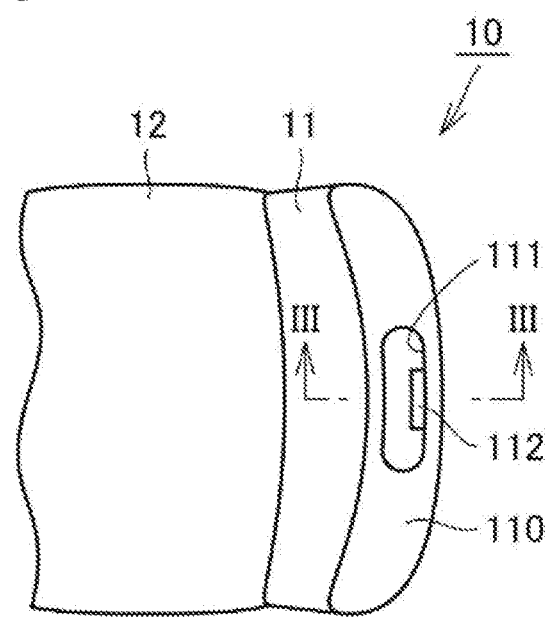
FIG. 2 is a plan view of the chair as viewed from the direction indicated by arrow II in FIG. 1.
Figure 3:
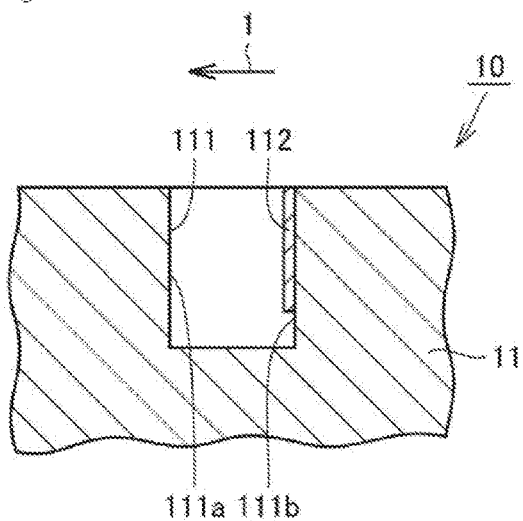
FIG. 3 is a cross-sectional view taken along line III-III in FIG. 2.

FIG. 1 is a side view of a chair in accordance with Embodiment 1. FIG. 2 is a plan view of the chair as viewed from the direction indicated by arrow II in FIG. 1. FIG. 3 is a cross-sectional view taken along line III-III in FIG. 2.

Referring to FIGS. 1 to 3, a chair 10 includes a backrest 11 and a seating face 12. The backrest 11 has a top face 110 in which there is provided a recess 111. There is provided a solar panel 112 in the recess 111.

Light shines on the backrest 11 from the direction indicated by arrow 201, whereas the user views the backrest 11 from the direction indicated by arrow 202. The solar panel 112 degrades the high-quality design of the chair 10 if the solar panel 112 is disposed in such a position that the user can visually recognize the solar panel 112 from behind the backrest 11. This is avoided by providing the chair 10 with the recess 111, which extends vertically from the top face 110, and disposing the solar panel 112 inside the recess 111.

The recess 111 is specified by a front internal face 111a located closer to the seating face 12 and a rear internal face 111b located farther from the seating face 12. The solar panel 112 is disposed on the rear internal face 111b.

Because arrow 1 indicates a forward direction, the solar panel 112 is barely visible from behind the backrest 11.

Figure 4:
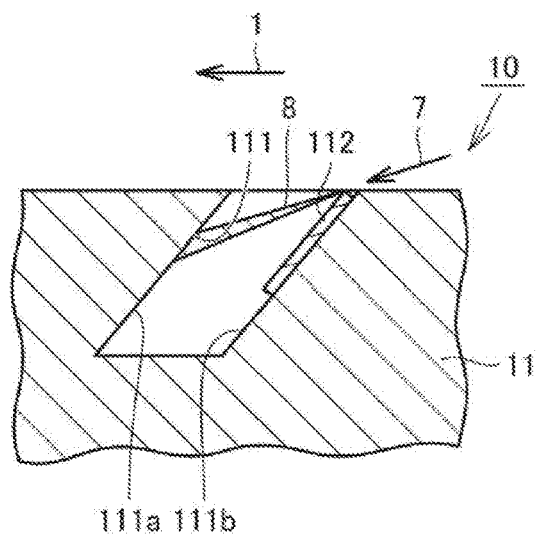
FIG. 4 is a cross-sectional view of a portion corresponding to FIG. 3, illustrating an inclined recess.
Figure 5:
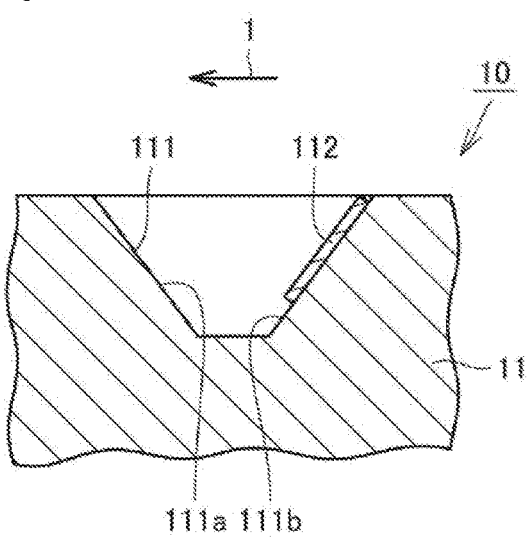
FIG. 5 is a cross-sectional view of a portion corresponding to FIG. 3, illustrating a recess with a wide opening.

FIG. 4 is a cross-sectional view of a portion corresponding to FIG. 3 in accordance with another embodiment, illustrating an inclined recess. FIG. 5 is a cross-sectional view of a portion corresponding to FIG. 3 in accordance with another embodiment, illustrating a recess with a wide opening.

Since light shines from above as indicated by arrow 201 in FIG. 1, the recess 111 may be inclined so that the solar panel 112 can be disposed on its inclined face, in order to expose more of the solar panel 112 to light. The recess shown in FIG. 4 is more inclined off the vertical direction than the recess shown in FIG. 3. As a result, more of the solar panel 112 is exposed to light, which increases power generation.

Since the solar panel 112 is disposed on the rear internal face 111b, more light shines on the solar panel 112 when the rear internal face 111b is inclined such that deeper parts thereof are located closer to the front of the chair 10. If the solar panel 112 is located near the opening of the recess 111, light travelling in the direction indicated by arrow 7 will likely cast a shadow 8. The solar panel 112 is therefore preferably located far from the opening to admit more light into the recess 111.

Alternatively, the opposing side faces of the recess 111 may be inclined in opposite directions as shown to FIG. 5. In such an example, the width of the bottom of the recess 111 (the left-to-right length in FIG. 5) is smaller than the area of the opening of the recess 111. The width of the bottom of the recess 111 is approximately equal to the width of the opening of the recess 111 in FIGS. 3 and 4.

The increased opening area of the recess 111 shown to FIG. 5 allows for light to shine on the solar panel 112 from the front as well as from the above. The structure therefore further increases power generation of the solar panel 112.

The increased opening area of the recess 111 also facilitates the installation of the solar panel 112 in the recess 111, thereby improving manufacturability. The opening may be of any size and preferably has dimensions of, for example, 1 cm×3 cm. When the solar panel 112 includes a plurality of solar cells connected in series or ease in the installation of the solar panel 112 is a priority, the opening preferably measures 5 cm×20 cm or have greater dimensions. The opening is not necessarily rectangular in shape and may have a curved side(s).

The side and/or bottom faces of the recess 111 may have rows of projections thereon. Each projection preferably has a height of 0.1 mm to 1 mm above the side or bottom face (reference face) of the recess 111. Each projection also preferably has a longer diameter of 0.1 mm to 2 mm in a cross-section thereof taken parallel to the side or bottom face (reference face). The provision of these rows of projections enables the light entering the recess 111 to scatter light inside the recess 111, thereby improving illuminance on the light-receiving face of the solar panel 112.

The side and bottom faces of the recess 111 preferably have a bright, reflective color. The side and bottom faces of the recess 111 have a color with a reflectance of preferably from 30% to 99.9%, both inclusive, and more preferably from 70% to 99.9%, both inclusive, for incident light in the visible region. A higher light reflectance in the visible region enables more of the light entering the recess 111 to scatter inside the recess 111, thereby improving illuminance on the light-receiving face of the solar panel 112.

Embodiment 2

Figure 6:
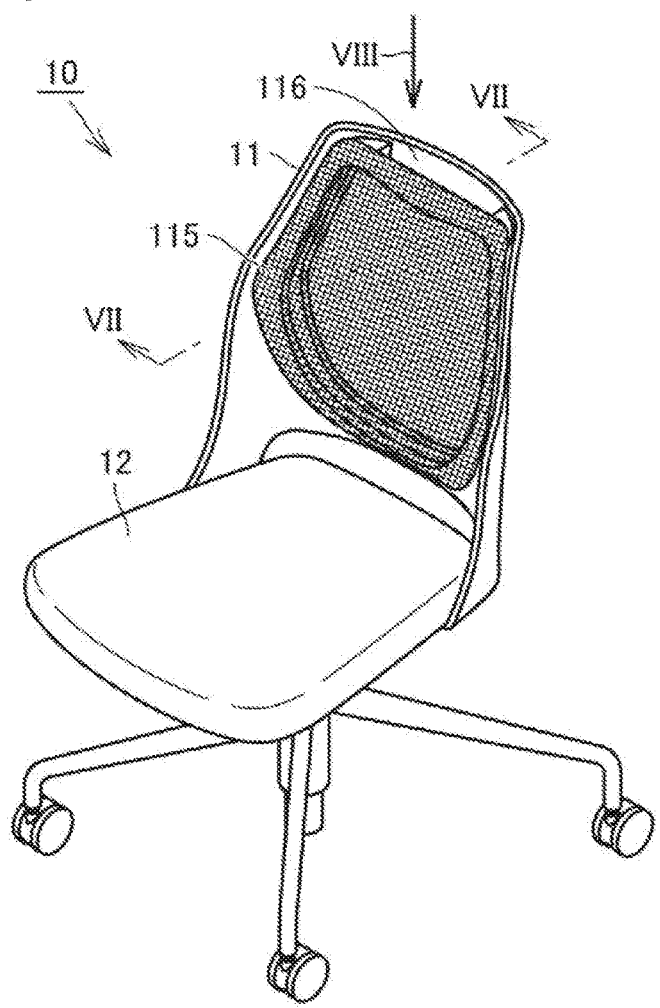
FIG. 6 is a perspective view of a chair in accordance with Embodiment 2.
Figure 7:
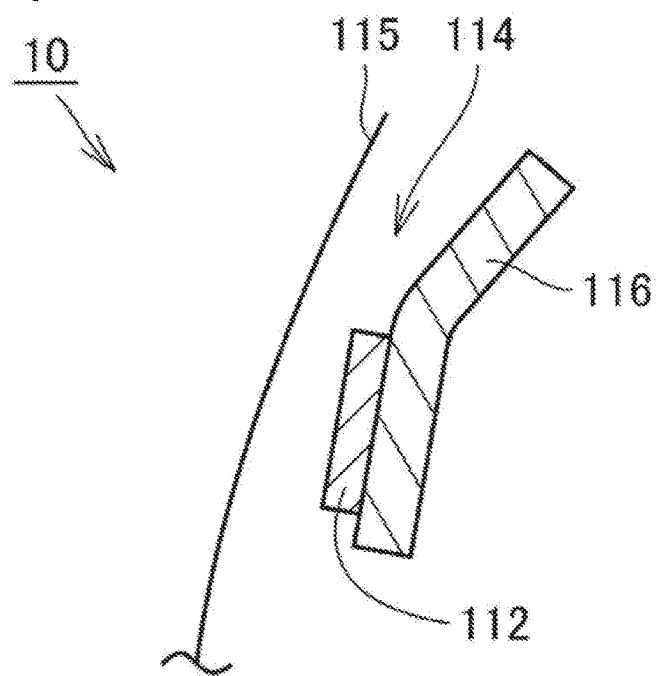
FIG. 7 is a cross-sectional view taken along line VII-VII in FIG. 6.
Figure 8:
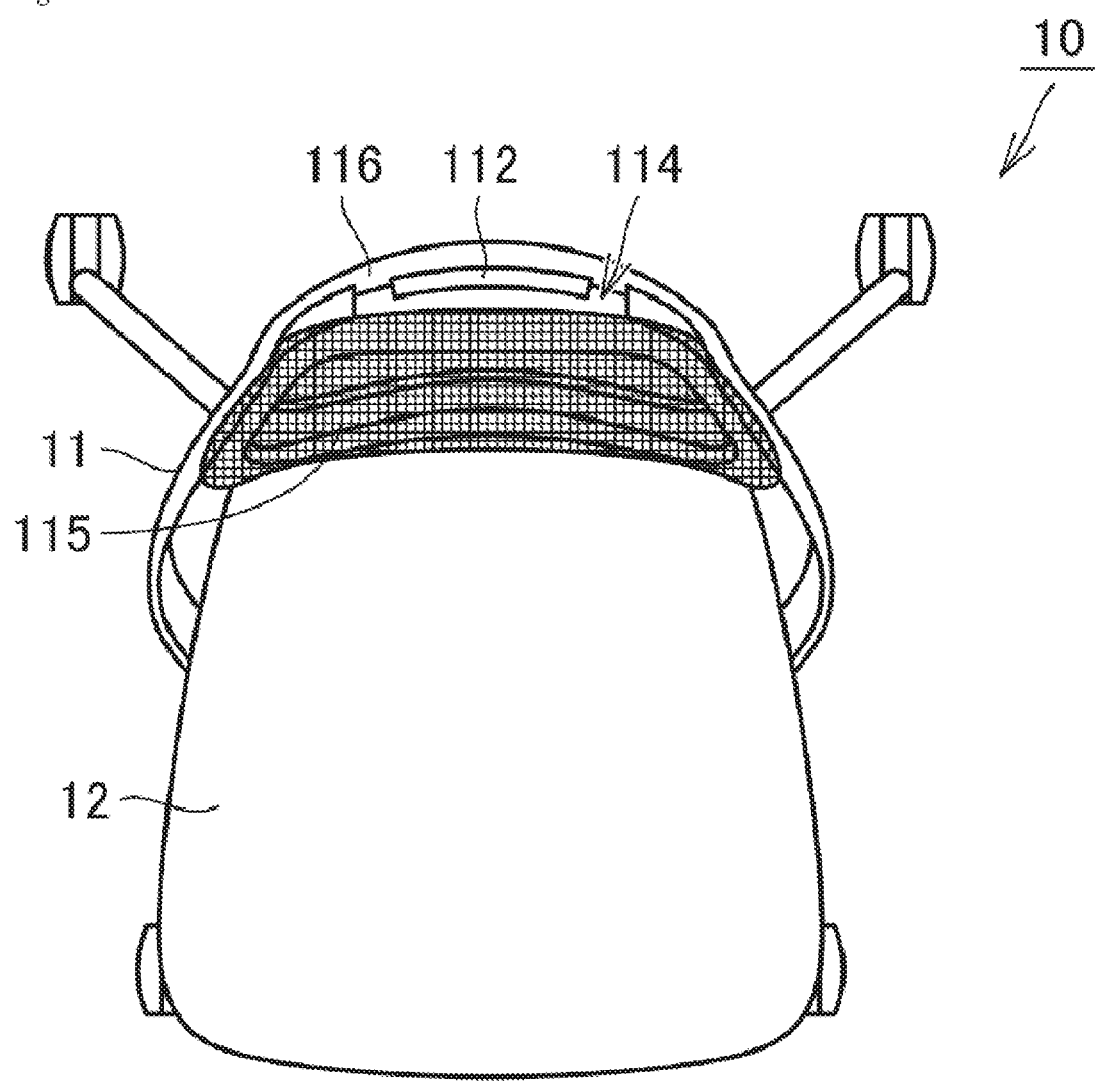
FIG. 8 is a plan view of the chair as viewed from the direction indicated by arrow VIII in FIG. 6.

FIG. 6 is a perspective view of a chair in accordance with Embodiment 2. FIG. 7 is a cross-sectional view taken along line VII-VII in FIG. 6. FIG. 8 is a plan view of the chair as viewed from the direction indicated by arrow VIII in FIG. 6.

Referring to FIGS. 6 to 8, the chair in accordance with Embodiment 2 includes a backrest including: a frame 116; and an abutment member 115 supported by the frame 116. There is provided an opening 114 between the frame 116 and the abutment member 115.

The abutment member 115 is composed of, for example, woven fabric or porous substance. The abutment member 115 abuts the back of a user seated on the seating face 12.

The abutment member 115, being elastic, takes such a shape as to fit the user's back.

The frame 116 serves to support and position the abutment member 115.

The solar panel 112 is disposed on the surface of the frame 116 in an opening between the frame 116 and the abutment member 115. Because the frame 116 is positioned on the backside of the solar panel 112, the solar panel 112 is barely visible from behind the chair.

In this embodiment, the abutment member 115, which has a net-like structure, is used in a portion of the chair that comes into contact with the user. Alternatively, the portion may have a non-net structure such as a plate or a film.

The backrest includes: an abutment member configured to come into contact with a user's back; and a frame positioning the abutment member, the opening being provided between the frame and the abutment member.

The solar panel 112 in this embodiment is disposed between the abutment member 115 and the frame 116 supporting an upper portion of the backrest 11. The solar panel 112 may, alternatively, be disposed, for example, in an opening below the frame 116.

Embodiment 3

Figure 9:
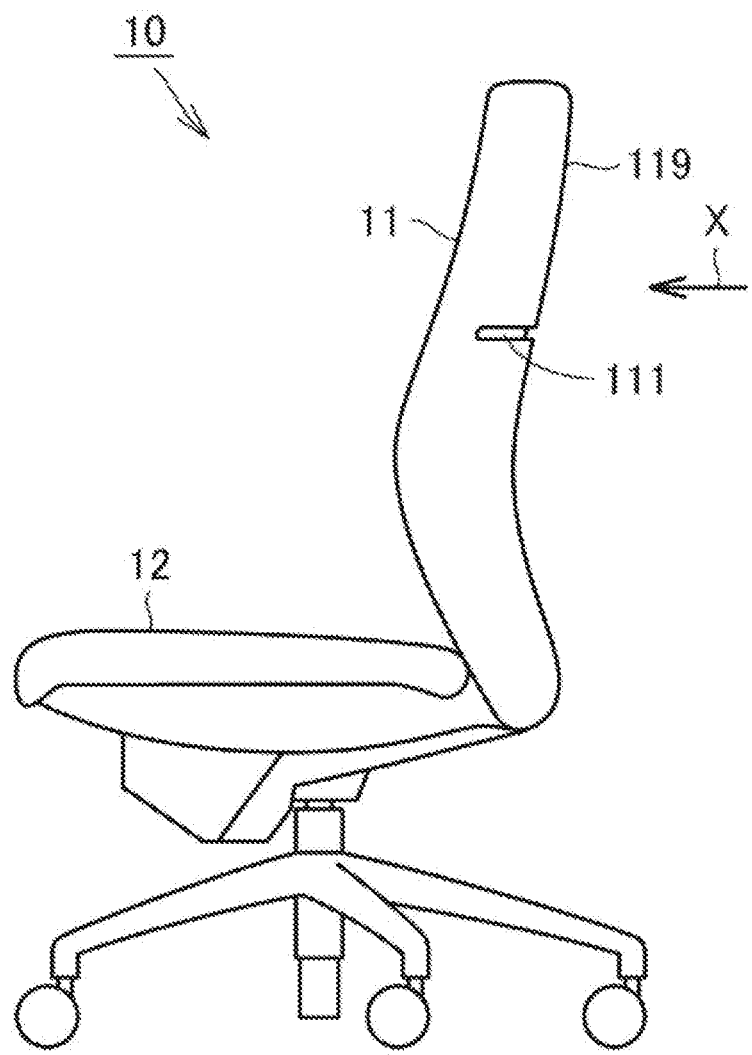
FIG. 9 is a side view of a chair in accordance with Embodiment 3.
Figure 10:
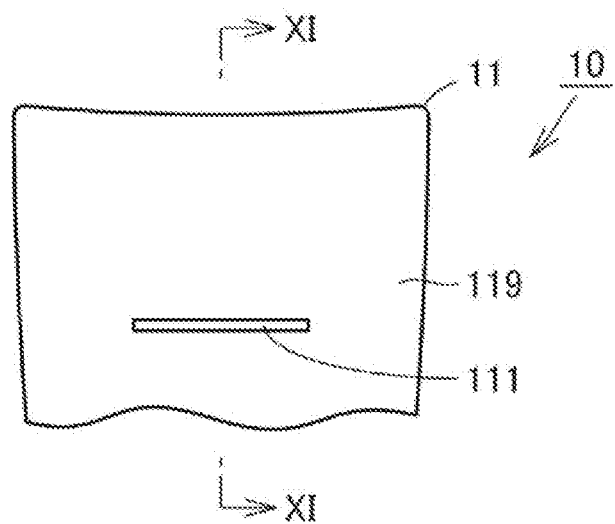
FIG. 10 is a rear view of the chair as viewed from the direction indicated by arrow X in FIG. 9.
Figure 11:
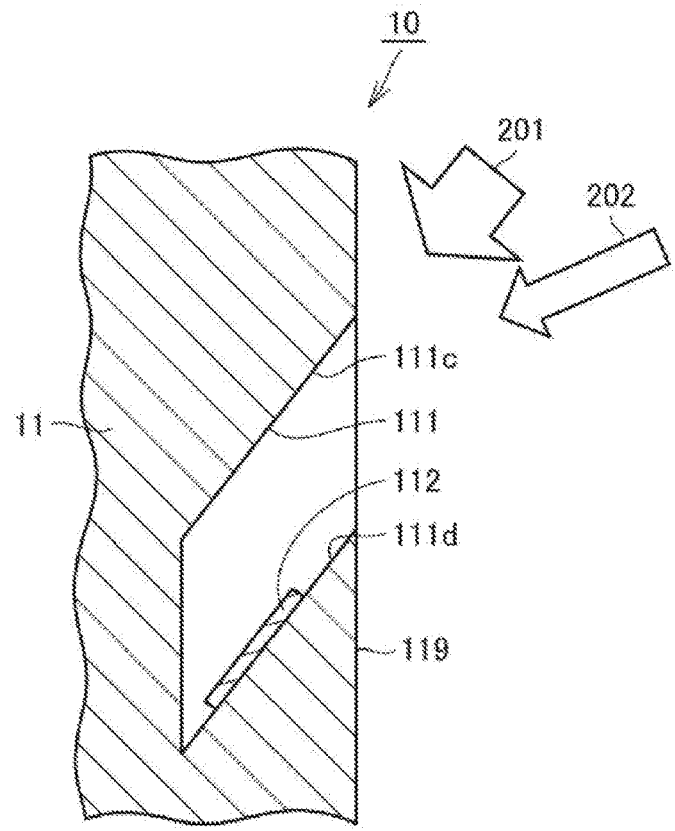
FIG. 11 is a cross-sectional view taken along line XI-XI in FIG. 10.

FIG. 9 is a side view of a chair in accordance with Embodiment 3. FIG. 10 is a rear view of the chair as viewed from the direction indicated by arrow X in FIG. 9. FIG. 11 is a cross-sectional view taken along line XI-XI in FIG. 10.

Referring to FIGS. 9 to 11, the recess 111 is provided in a rear face 119 of the backrest 11 in a chair 10 in accordance with Embodiment 3. The recess 111 is shaped like a horizontally extended slit. The recess 111 is structured to have side faces extending downward from the opening into the recess.

The recess 111 is specified by an upper internal face 111$c$ of the backrest 11 and a lower internal face 111$d$ of the backrest 11 below the upper internal face 111$c$. The solar panel 112 is disposed on the lower internal face 111$d$.

This structure takes into consideration the line of sight of the user indicated by arrow 202 and is intended to render the solar panel 112 barely visible.

Meanwhile, since light shines on the solar panel 112 from the direction indicated by arrow 201, the solar panel 112 can generate electric power.

Embodiment 4

Figure 12:
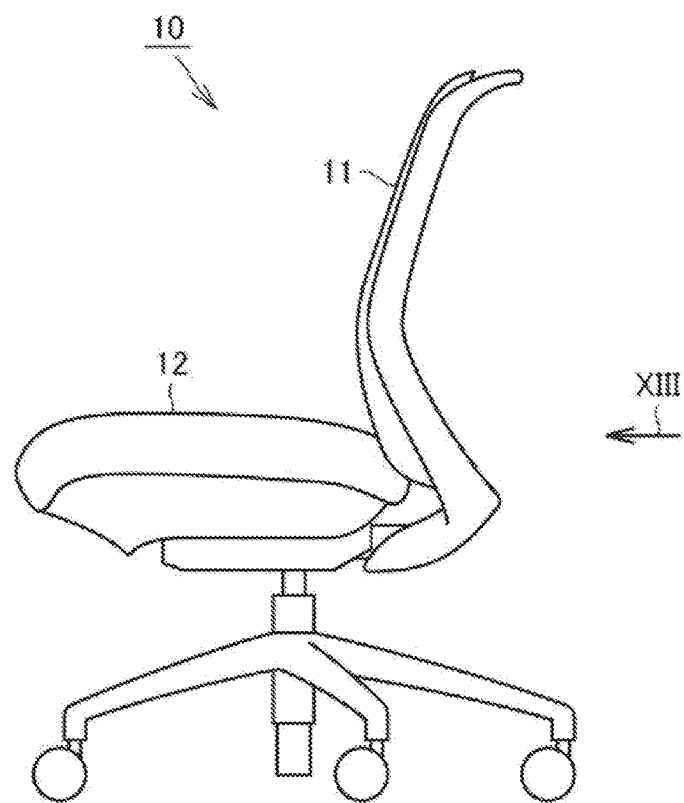
FIG. 12 is a side view of a chair in accordance with Embodiment 4.
Figure 13:
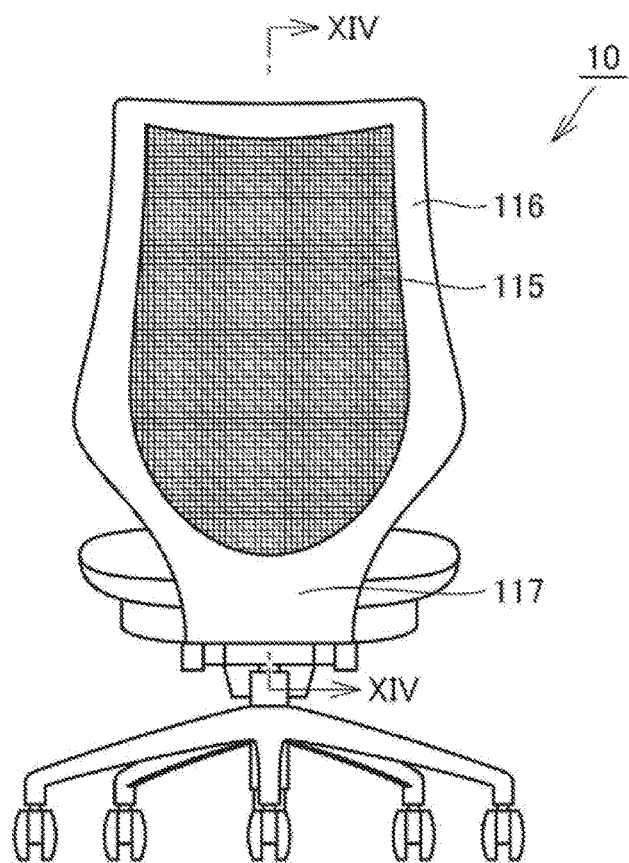
FIG. 13 is a rear view of the chair as viewed from the direction indicated by arrow XIII in FIG. 12.
Figure 14:
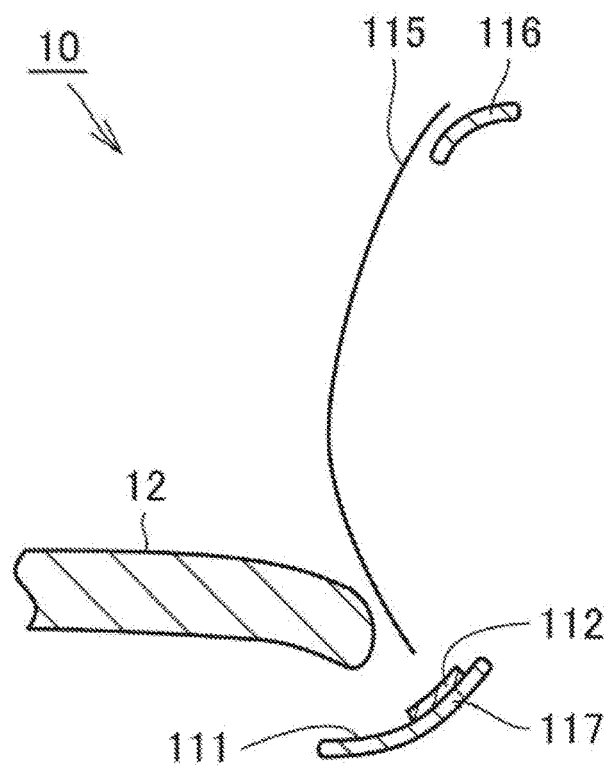
FIG. 14 is a cross-sectional view taken along line XIV-XIV in FIG. 13.

FIG. 12 is a side view of a chair in accordance with Embodiment 4. FIG. 13 is a rear view of the chair as viewed from the direction indicated by arrow XIII in FIG. 12. FIG. 14 is a cross-sectional view taken along line XIV-XIV in FIG. 13.

Referring to FIGS. 12 to 14, in a chair 10 in accordance with Embodiment 4, the recess 111 is formed by a support 117 supporting the frame, and the solar panel 112 is disposed inside the recess 111. The support 117, supporting the frame 116, is made of a flexible material so as to allow the user to change posture while placing his/her body weight onto the backrest 11. The support 117 and the frame 116 form a single unit in this embodiment. Alternatively, the frame 116 and the support 117 may be provided as separate members such that the frame 116 can pivot relative to the support 117.

The support 117 is interposed between the backrest 11 and the seating face 12. The support 117 supports the frame 116 and the seating face 12. The recess 111 is provided by the support 117. The disposition of the solar panel 112 in the recess 111 hence renders the solar panel 112 barely visible to a person standing behind the chair 10. Meanwhile, because light reaches the light-receiving face of the solar panel 112, the solar panel 112 can generate electric power.

Embodiment 5

Figure 15:
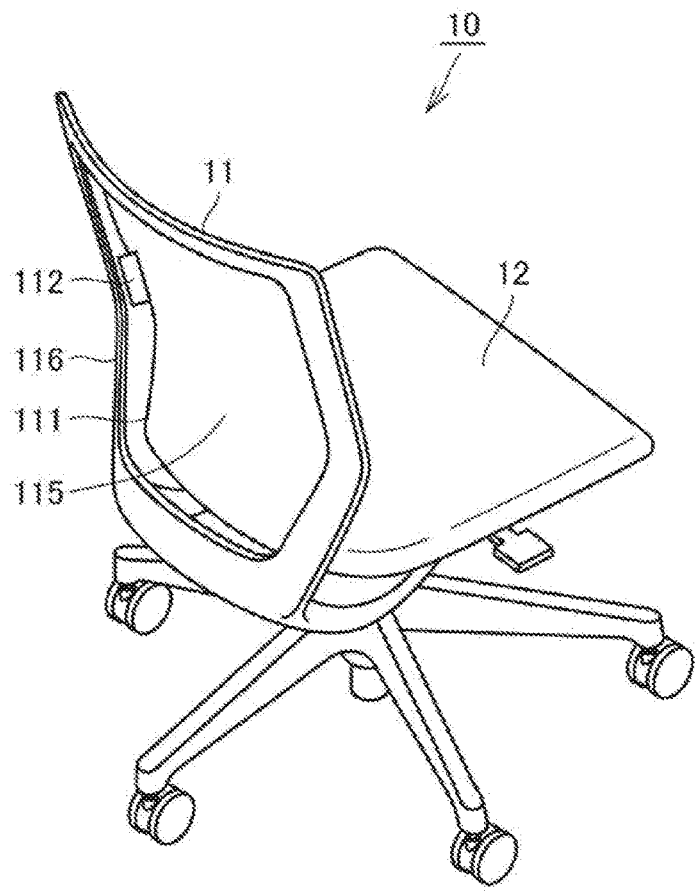
FIG. 15 is a perspective view of a chair in accordance with Embodiment 5.

FIG. 15 is a perspective view of a chair in accordance with Embodiment 5. Referring to FIG. 15, the recess 111 is formed by the frame 116 in a chair 10 in accordance with Embodiment 5. The recess 111 is provided between the frame 116 supporting the side faces of the backrest 11 and the abutment member 115 of the backrest 11 that comes into contact with a user's back. The solar panel 112 is disposed inside the recess 111.

Embodiment 6

Figure 16:
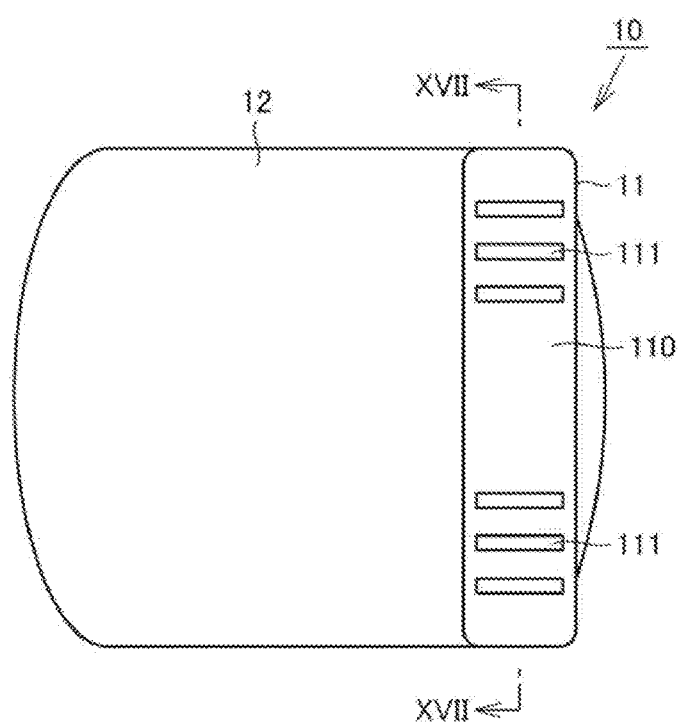
FIG. 16 is a plan view of a chair in accordance with Embodiment 6.
Figure 17:
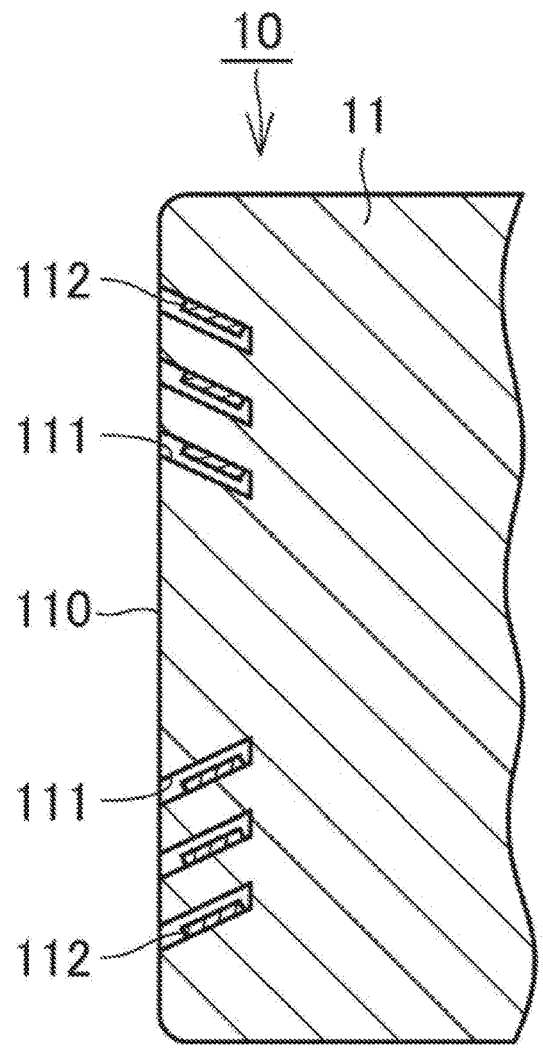
FIG. 17 is a cross-sectional view taken along line XVII-XVII in FIG. 16.

FIG. 16 is a plan view of a chair in accordance with Embodiment 6. FIG. 17 is a cross-sectional view taken along line XVII-XVII in FIG. 16.

Referring to FIGS. 16 and 17, there is provided a plurality of slit-shaped recesses 111 in the top face 110 of the backrest 11 in a chair 10 in accordance with Embodiment 6. In this embodiment, six recesses 111 are provided.

The recesses 111 extend obliquely to the top/bottom direction with respect to the chair 10 in the plane of the paper on which FIG. 16 is drawn (the lengthwise direction of the top face of the backrest 11). This structure is intended to increase the area of the solar panel 112 that is exposed to light when light shines on the solar panel 112 from the above.

Embodiment 7

Figure 18:
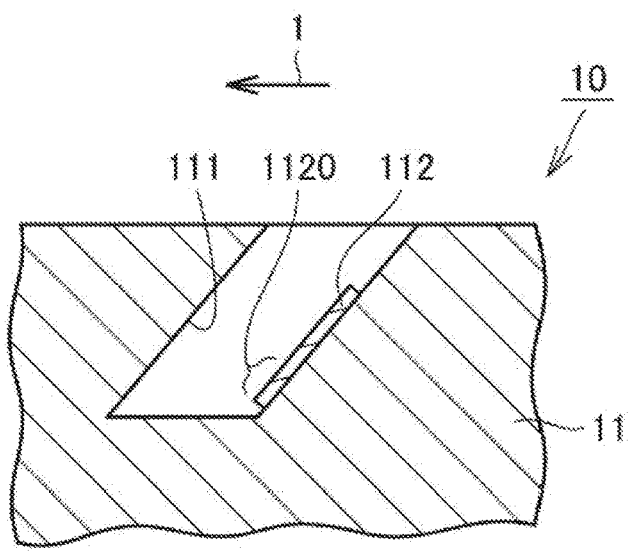
FIG. 18 is a cross-sectional view of the backrest of a chair in accordance with Embodiment 7.
Figure 19:
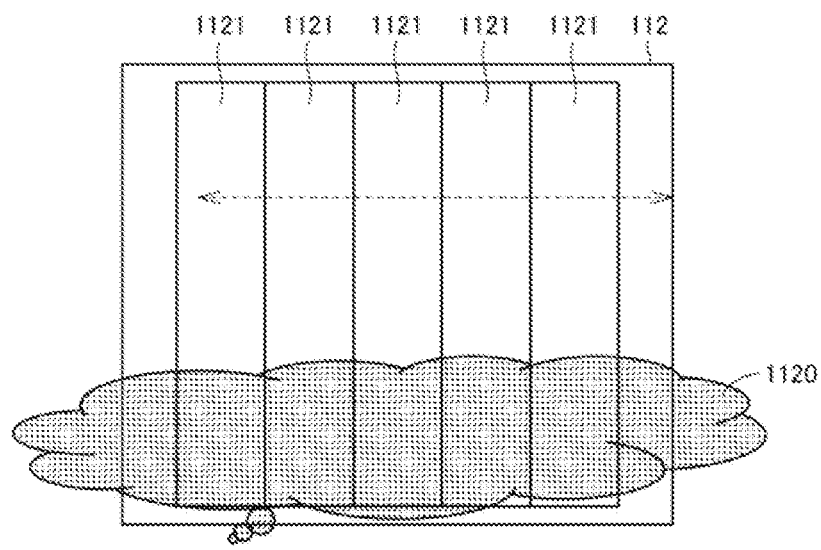
FIG. 19 is a plan view of a shadow shown in FIG. 18.
Figure 20:
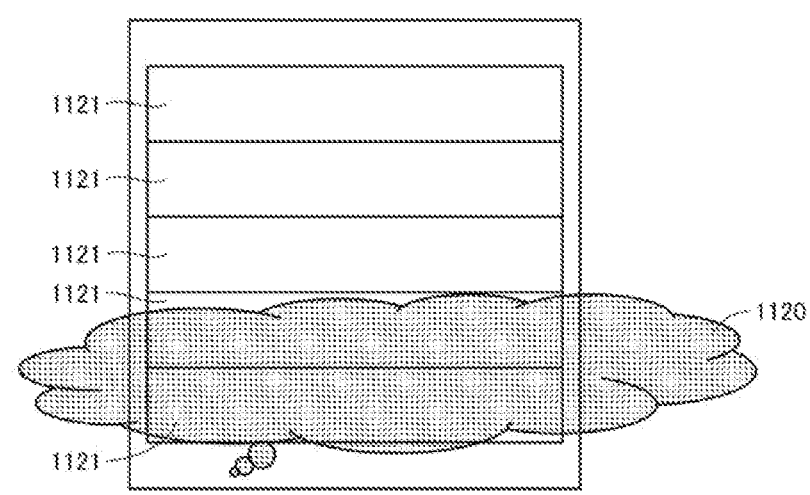
FIG. 20 is a plan view of a shadow shown in FIG. 18.

FIG. 18 is a cross-sectional view of the backrest of a chair in accordance with Embodiment 7. FIGS. 19 and 20 are plan views of a shadow on the solar panel shown in FIG. 18. The solar panel 112 includes a plurality of solar cells 1121 connected in series. Each solar cell 1121 is rectangular and includes a single dye-sensitized solar cell.

A comparison is made between a case shown in FIG. 19 where each solar cell 1121 is partly covered by a shadow 1120 and a case shown in FIG. 20 where some of the solar cells 1121 are completely covered by the shadow 1120. The solar panel 112 outputs a larger current in the case shown in FIG. 19. The arrangement shown in FIG. 19 is more preferable because the arrangement can reduce the influence of the shadow 1120 to a minimum. In other words, the solar panel 112 is preferably positioned such that the shadow 1120 does not cover the entire length of any one of the solar cells 1121 as shown in FIG. 19.

The present invention has been described so far by way of embodiments. These embodiments may be altered in various manners.

The faces of the recess 111 and the opening 114 preferably have a color with a high reflectance or scattering rate in order to reflect much light. The chair 10 may or may not have a castor and an armrest. The opening 114 or the recess 111 may be covered by a member transmitting electromagnetic waves that can be used in the solar panel 112. In such cases, since the solar panel 112 in the opening 114 or the recess 111 is hidden by that member, the solar panel 112 does not damage high-quality design.

The embodiments disclosed herein are for illustrative purposes only in every respect and provide no basis for restrictive interpretations. The scope of the present invention is defined only by the claims and never bound by the specification. Those modifications and variations that may lead to equivalents of claimed elements are all included within the scope of the invention.

The present international application claims priority to Japanese Patent Application No. 2017-138176 filed on Jul. 14, 2017, the entire contents of which are incorporated herein by reference.

REFERENCE SIGNS LIST

10 Chair
11 Backrest
12 Seating Face
110 Top Face
111 Recess
111$a$ Front Internal Face 111b Rear Internal Face
111c Upper Internal Face
111d Lower Internal Face
112 Solar Panel
114 Opening
115 Abutment Member
116 Frame
117 Support
119 Rear Face
1120 Shadow
1121 Solar Cell

The invention claimed is:

1. A chair with a solar panel, the chair comprising:
a backrest having an opening or a recess in a portion thereof; and
a solar panel disposed on a face inside the opening or the recess, wherein the solar panel is barely visible from outside,
the solar panel generates electric power while remain in the opening or the recess, and
the solar panel is disposed on only one side of an opening wall or a recess wall.

2. The chair according to claim 1, wherein the backrest has the recess and the backrest is provided in a top face of the backrest.

3. The chair according to claim 2, further comprising a seat connected to the backrest, wherein
the recess is specified by a front internal face of the backrest and a rear internal face of the backrest with a direction of the seat as a front of the chair, and
the solar panel is disposed on the rear internal face.

4. The chair according to claim 3, wherein the rear internal face is inclined such that deeper parts thereof are located closer to the front of the chair.

5. The chair according to claim 1, a seat connected to the backrest, wherein the backrest includes:
an abutment member configured to come into contact with a user's back while the user is sitting on the seat; and
a frame positioning the abutment member, and the opening or the recess is opening being provided between the frame and the abutment member.

6. The chair according to claim 1, wherein further comprising
a seat connected to the backrest,
the backrest has the recess and
the recess is provided in a rear face of the backrest with a direction of the seat as a front of the chair.

7. The chair according to claim 6, wherein
the recess is specified by an upper internal face of the backrest and a lower internal face of the backrest below the upper internal face, and
the solar panel is disposed on the lower internal face.

8. The chair according to claim 1, a seat connected to the backrest, wherein the backrest includes:
an abutment member configured to come into contact with a user's back while the user is sitting on the seat; and
a frame positioning the abutment member,
the backrest further including a support supporting the frame and the seat, and
the recess is provided in the support.

9. The chair according to claim 1, further comprising a seat connected to the backrest, wherein the backrest includes:
an abutment member configured to come into contact with a user's back while the user is sitting on the seat; and
a frame positioning the abutment member, and the opening is provided between the frame and the abutment member.

10. The chair according to claim 1, wherein
the solar panel includes a plurality of solar cells connected in series,
each solar cell has a long direction and a short direction,
each solar cell is arranged along the short direction of each solar cell in the solar panel and
along the opening edge of the opening or the recess.

11. The chair according to claim 1, wherein the opening or the recess is covered by a member transmitting electromagnetic waves that can be used in the solar panel.

12. The chair according to claim 1, a seat connected to the backrest, wherein the backrest includes:
woven fabric or porous substance and a frame positioning the woven fabric or porous substance, and
the opening or the recess is provided between the frame and the abutment member.

* * * * *